United States Patent [19]
Feher

[11] Patent Number: 5,850,741
[45] Date of Patent: Dec. 22, 1998

[54] AUTOMOTIVE VEHICLE STEERING WHEEL HEATING AND COOLING APPARATUS

[76] Inventor: Steve Feher, 1 Keahole Pl. Ste. 1505, Honolulu, Hi. 96825

[21] Appl. No.: 871,870

[22] Filed: Jun. 9, 1997

[51] Int. Cl.[6] .................................................. F25B 21/02
[52] U.S. Cl. ............................................. 62/3.61; 165/41
[58] Field of Search ........................... 62/3.2, 3.3, 3.61, 62/239, 331; 165/41

[56] References Cited

U.S. PATENT DOCUMENTS

| | | | |
|---|---|---|---|
| 4,640,340 | 2/1987 | Noda et al. | 165/41 |
| 4,823,554 | 4/1989 | Trachtenberg et al. | 62/3.61 |
| 5,099,649 | 3/1992 | Zorn | 62/3.61 |
| 5,623,828 | 4/1997 | Harrington | 62/3.2 |

*Primary Examiner*—William Doerrler
*Attorney, Agent, or Firm*—George J. Netter

[57] ABSTRACT

A vehicle steering wheel (12) has the temperature of its normally gripped regions (16, 18) modified from extremes to acceptable values by a heat pump (20) with heat transfer occurring along heat pipe sections (22, 24) between primary heat exchangers (26, 28) at the gripped regions (16,18) and a temperature modifiable surface (33). Circuit apparatus (67) automatically energizes the heat pump (20) to provide heating or cooling, as needed.

17 Claims, 4 Drawing Sheets

AUTOMOTIVE VEHICLE STEERING WHEEL HEATING AND COOLING APPARATUS

BACKGROUND

1. Field of the Invention The present invention relates generally to an automotive vehicle, and, more particularly, to apparatus for selectively cooling or heating the steering wheel of such an automotive vehicle to increase comfort and safety of the driver.

2. Description of Related Art

It is a common experience on initiating use of an automobile during cold weather to find the steering wheel cold to the touch making the initial 5 to 10 minutes of driving uncomfortable and possibly even dangerous.

Also, in the summertime especially in the tropics, for example, where the temperature can become quite high, it is a common undesirable experience on first entering a parked automobile to find the steering wheel to be at such an elevated temperature that it cannot be comfortably or possibly even safely handled.

In both cases, it would be desirable to be able to quickly change the extreme temperature of an automotive vehicle steering wheel to a more moderate temperature. Not only would this be more comfortable for the driver, but it could actually improve safety of vehicle operation during that period normally required to have the steering wheel temperature become modified to comfortable levels as a result of mere handling of the wheel or by the internal ambient temperature becoming more moderate through operation of the vehicle air conditioning system or heater. Of course, many automotive vehicles include a heater for use in cold weather as well as an air conditioning unit for cooling the vehicle interior during hot weather. However, in both cases it takes a relatively lengthy time, e.g., as long as 10 minutes, for the vehicle interior to have its temperature changed to a more comfortable range during which time the steering wheel remains at an extreme temperature uncomfortable to the touch.

It is, therefore, a desideratum and primary object of the present invention to provide selective and relatively rapid temperature modification of a vehicle steering wheel to a predetermined acceptable range.

SUMMARY OF THE INVENTION

In accordance with the practice of the present invention there is provided a selectively actuatable heat pump preferably of the thermoelectric variety which is mounted to the far side of the steering wheel adjacent the steering column. The heat pump is energizable electrically to provide either a warm or cold surface, as desired. First and second heat pipes each have one end connected to the heat pump modified temperature surface and extend along the back side of radial supports for the steering wheel to terminate, respectively, at approximately eight o'clock and four o'clock positions on the normal wheel gripping portion as viewed from the driver's side. First and second heat exchangers are located on the steering wheel rim at these eight o'clock and four o'clock locations in good heat conducting relationship to outer ends of the heat pipes.

In use, the heat pump is selectively actuated to provide either a heated surface for cold weather conditions or a cooled surface for hot weather situations. The modified temperature surface applied to the heat pipes results in efficient heat transfer along the heat pipes to heat or cool the main heat exchangers, as the case may be, and in that way the steering wheel where it is gripped by a driver while driving. This moderation of the steering wheel temperature is accomplished relatively instantaneously allowing the user of the vehicle to operate it immediately without discomfort to the hands.

BRIEF DESCRIPTION OF THE DRAWING

These and other objects and advantages of the present invention will become more readily apparent upon reading the following detailed description and upon reference to the attached drawings, in which.

DESCRIPTION OF PREFERRED EMBODIMENTS

Figure 1:
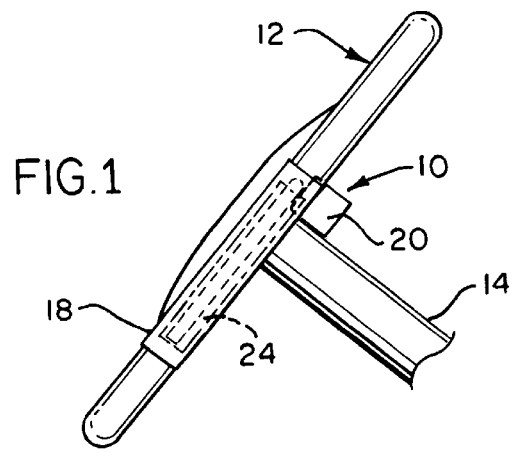
FIG. 1 is a side elevational view of the invention shown mounted onto a vehicle steering wheel.
Figure 2:
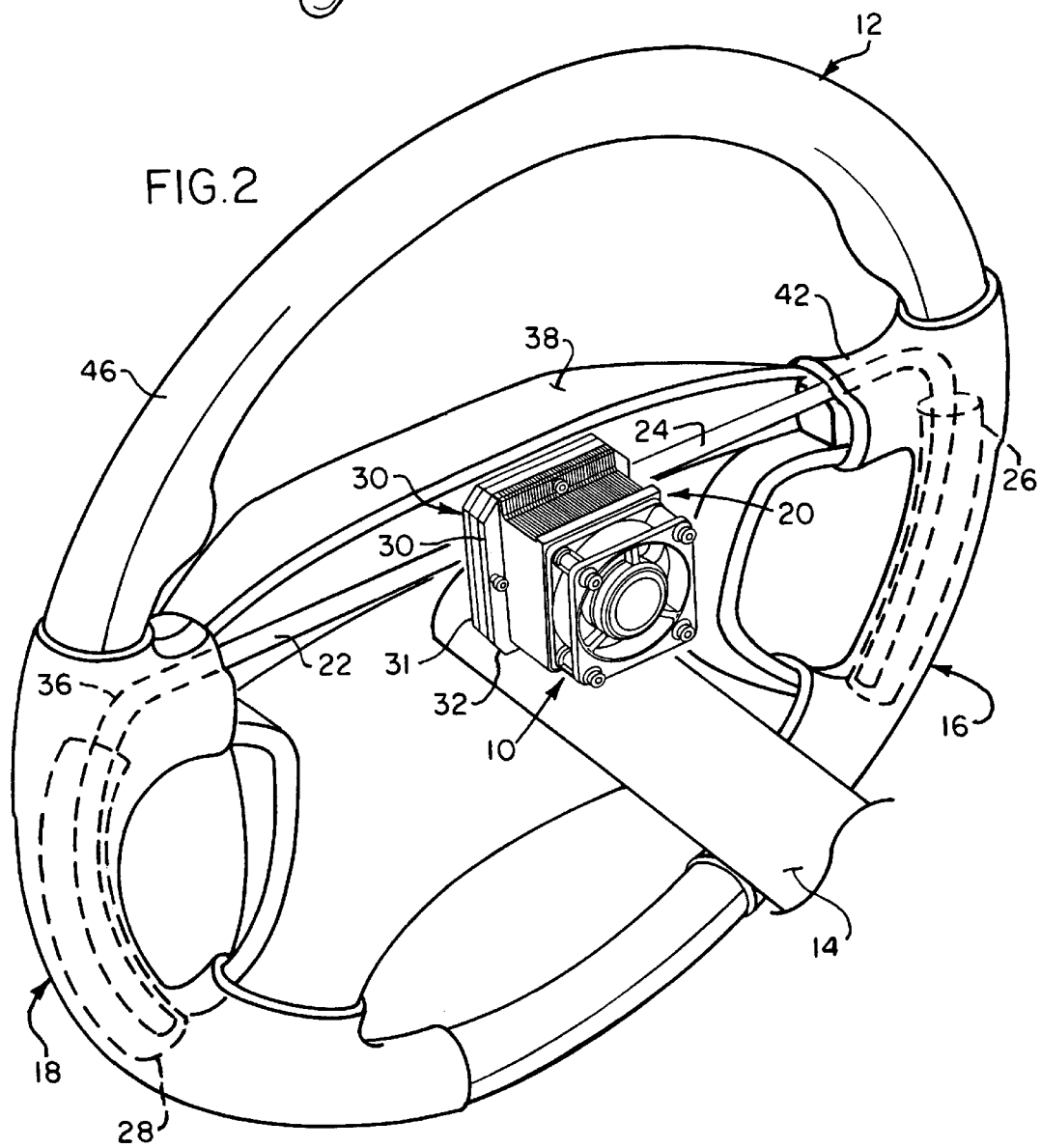
FIG. 2 is a rear, partially sectional view of the invention.

With reference now to the drawings, and particularly FIGS. 1 and 2, the invention of the present invention enumerated generally as 10 is seen to be mounted onto an automotive vehicle steering wheel 12 affixed in conventional manner to a steering column 14. Specifically, the steering wheel 12 is affixed to the upper end of the column 14 and includes first and second typical hand gripping regions 16 and 18 located at the eight to nine o'clock and three to four o'clock positions, respectively, of the wheel as viewed from the driver's side of the steering assembly. It is these gripping regions that are temperature conditioned or moderated by the invention.

Figure 3:
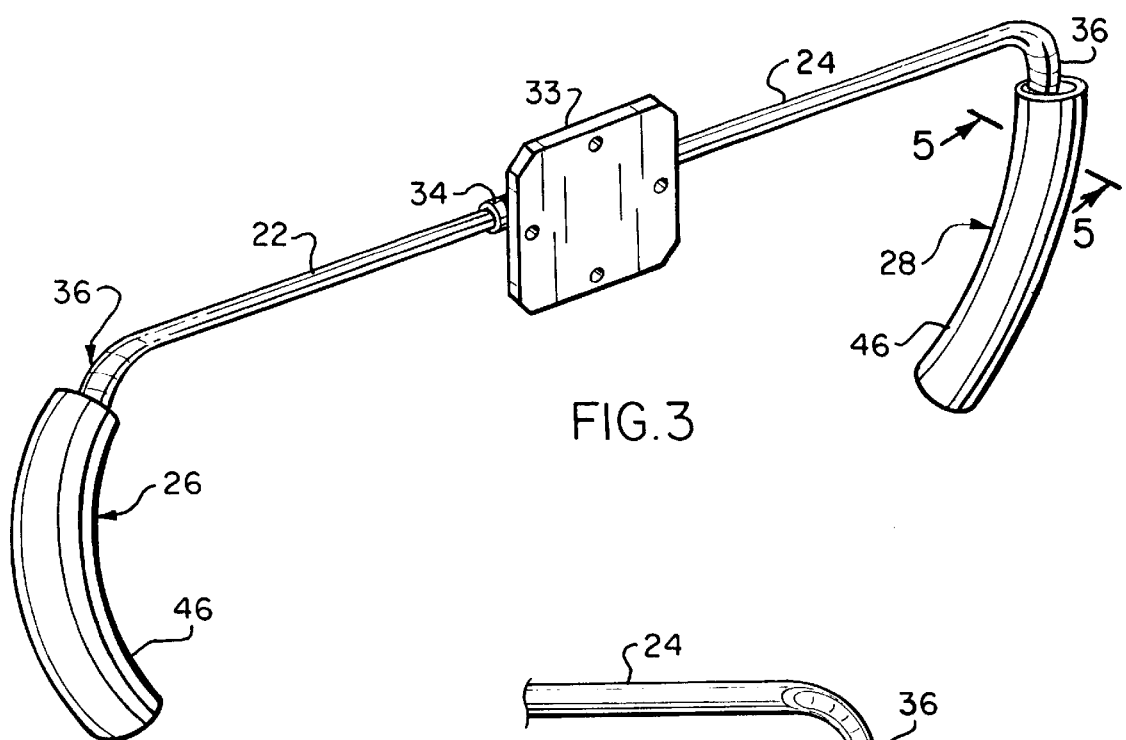
FIG. 3 is a view of the invention shown removed from the steering wheel.
Figure 4:
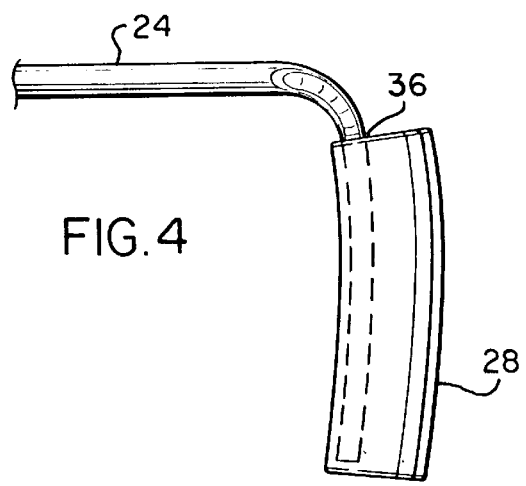
FIG. 4 is a fragmentary view of a hand-gripping part of a steering wheel provided with the invention.

In its major elements, the apparatus 10 is seen to include a heat pump 20 mounted to the rear or far side of the steering wheel adjacent the steering column and is interconnected with first and second heat pipe sections 22 and 24 extending toward and having respective end portions terminating within the gripping regions 16 and 18. First and second primary heat exchangers 26 and 28 in good heat conducting relation with the outer end portions of the heat pipe sections serve to transfer heat to or from, as the case may be, the hands of an individual gripping the steering wheel in the regions 16 and 18 for moderating the temperature felt from that which would be normally sensed when the steering wheel is at vehicle unconditioned ambient temperature (FIGS. 2, 3 and 4).

Figure 6:
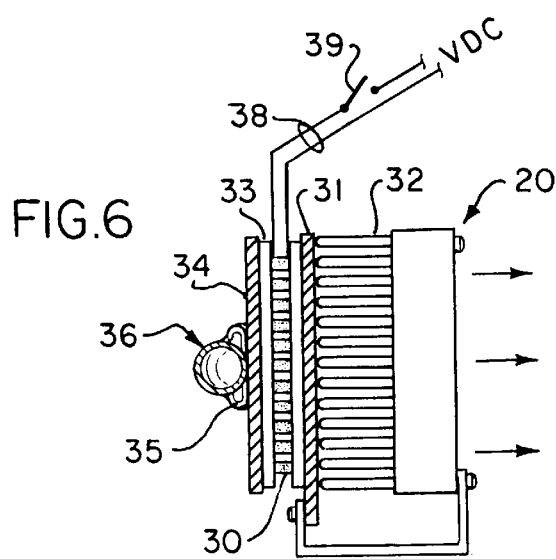
FIG. 6 is an elevational view of a heat pump.

Turning now to FIG. 6, the heat pump 20 is seen to include a thermoelectric device 30 which is preferably soldered at 31 to an auxiliary heat exchanger 32 located in the vehicle interior ambient air. A temperature modifiable surface 33 of the device 30 is secured in a good heat conducting relationship such as by a solder body 34, for example, to a slightly flattened cross-bar portion 35 of a generally U-shaped heat pipe 36, the two arms of which are the first and second heat pipe sections 22 and 24. In a way well known in the art, the heat pump 20 of the thermoelectric variety (e.g., Peltier) adds heat to or removes heat via the solder body 34 dependent upon the polarity of energizing voltage applied to the heat pump via lead wires 38 under the control of a mode switch 39.

A suitable thermoelectric heat pump for use in the present invention has the trade designation Model No. DT1049-04, manufactured by Marlow Industries, Inc., Callas Tex., which provides a 30 watt output in cooling mode with a 60 watt input. Another heat pump is available from this same company identified as Model DT1069 which provides 50 watts in cooling mode output when driven by an 80 watt input.

It has been found where an automotive vehicle has been seated in the sun with its windows rolled up, the interior including the steering wheel outer surface may rise to 140° F. or even higher which is clearly above outside ambient air temperature and cannot comfortably (or even perhaps safely) be negotiated with bare hands. It has also been found that the higher the absolute temperature the more efficient a thermoelectric device is in operation. Comparing these possible actual circumstances, the task at hand can be considered that of reducing the steering wheel grip temperature from as high as 140° F. to a safer and more comfortable range (e.g., 95°–100° F.). Accordingly, with this high absolute external ambient temperature, the thermo-electric device will operate at much better efficiency than could be expected at, say, room temperature operation (e.g., 72° F.).

The heat pipe 36 is generally dimensioned and of such a geometry that its outer two pipe sections 22 and 24 are bent downwardly at the circumferential portion of the steering wheel while the central cross-bar portion 35 extends from the steering column in opposite directions along the far side of a steering wheel radial arm 42. It is also preferable that the heat pipe be located within a matching slot 44 that extends along the radial arm 42 and circumferential wheel portion 46 as best shown in FIG. 5.

The heat pipe 36 is a well known device and should preferably be of the copper/water category in order to eliminate any possibility of a fire hazard such as might otherwise happen, for example, in case of a vehicle accident. An optional heat pipe which can be satisfactorily employed here is of the copper/methanol category. As to general heat pipe construction and operation, it includes a sealed metal tube (e.g., copper) that has had its internal cavity pumped down to a vacuum, which cavity is then charged with a working fluid, such as water or methanol. In heat mode operation, the fluid inside the heat pipe during heating mode tends to vaporize first and then condense on the inside walls releasing heat of condensation which warms the hand grip heat exchangers 26 and 28. The inside wall of the heat pipe is covered with a wicking material (not shown) which can be a finely woven mesh or sintered metal layer with fine pores which operates to wick the condensed fluid back to the evaporator section to repeat the cycle. Operation is reversed for cooling mode transfer of heat along the heat pipe.

Figure 5:
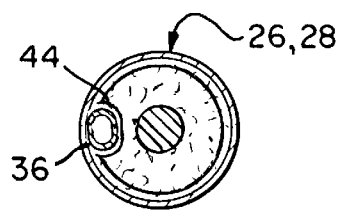
FIG. 5 is a sectional view along line 5—5 of FIG. 3.

Each of the primary heat exchangers 26 and 28 includes a slotted generally cylindrical metal body 47 (e.g., copper) which is fitted over the circumferential portion 46 of the steering wheel and contacting the outer end portion of the heat pipe (FIG. 5). As already noted, the two primary heat exchangers are located in the eight to nine o'clock region 16 and three to four o'clock region 18, respectively (FIGS. 2 and 3). These heat exchangers are so formed as to be in good contact with the internally located heat pipe section end portion such that heat can be transferred to or away from the heat exchangers and thus to or from the hands which are gripping the heat exchangers.

In the cooling mode, the thermoelectric heat pump device 30 operational efficiency can be enhanced by cooling that part 50 of the pump device where heat is removed to the ambient atmosphere via the auxiliary heat exchanger 32. More particularly, in the first described embodiment an electric fan 52 is mounted to an outer surface of the auxiliary heat exchanger with fan operating to draw cooling air from the heat exchanger and exhausting it remotely as indicated by the arrow in FIG. 6.

Figure 7:
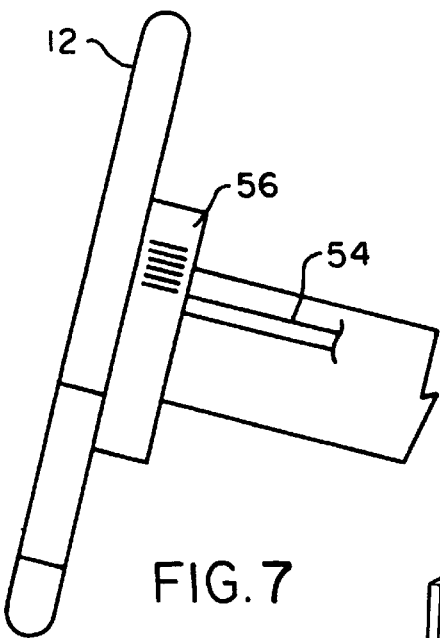
FIGS. 7, 8 and 9 are elevational views of further alternative embodiments.

For the ensuing description of a further embodiment of the invention having increased operational efficiency, reference is made to FIG. 7. A flexible hollow tube 54 has one end interconnected with the vehicle air conditioning fan blower (not shown, and typically located behind the dashboard). The tube other end is secured to the heat pump housing wall 56 with the such that the tube terminus is closely adjacent to and pointed to direct pressurized air from the air conditioning fan blower across the auxiliary exchanger 32 to cool the same and thereafter being entrained within the air removed by fan 52 already described. This additional cooling effect on the "hot" side of the heat pump device increases operational efficiency and thus speeds up cooling of the steering wheel.

Figure 8:
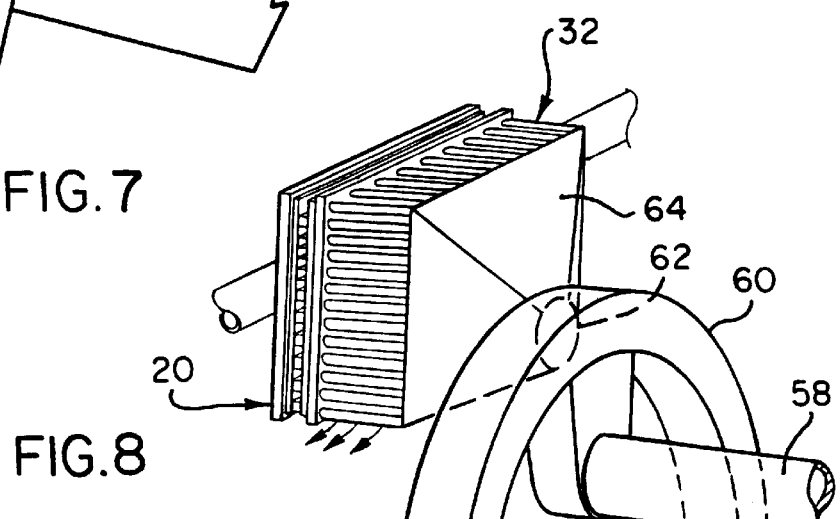
Figure 9:
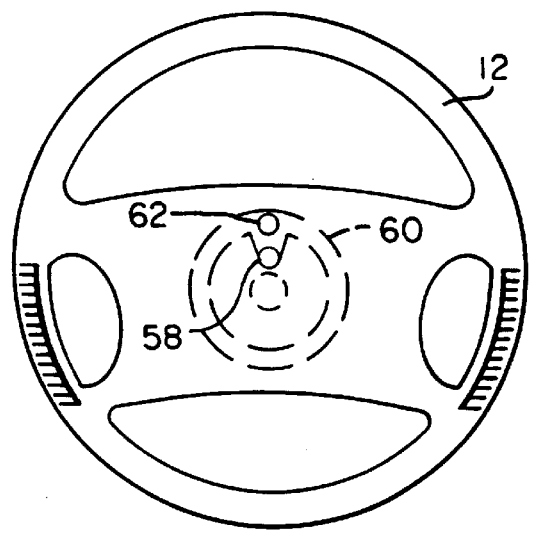

In FIGS. 8 and 9 there is depicted a still further version of the invention, also differing from the first embodiment primarily in offering additional cooling of the heat pump auxiliary heat exchanger to enhance operational efficiency when used in the cooling mode. As in the second described embodiment a further flexible tube 58 brings air from the vehicle air conditioning blower (not shown) along the steering column exterior to empty immediately adjacent the heat pump auxiliary heat exchanger 32. More particularly, a generally circular slip-ring housing 60 is affixed to the far side of the steering wheel 12 substantially encompassing the heat pump sides and serves to confine and direct the pressurized air stream exiting from tube 58 through opening 62 in a manifold 64 directly onto the exchanger 32. After cooling the heat exchanger, the air stream passes outwardly (arrows 66) of the heat exchanger 32 to the interior of the vehicle. In this version, the fan 52 may be eliminated which not only reduces cost, but also reduces noise level within the vehicle.

Figure 10:
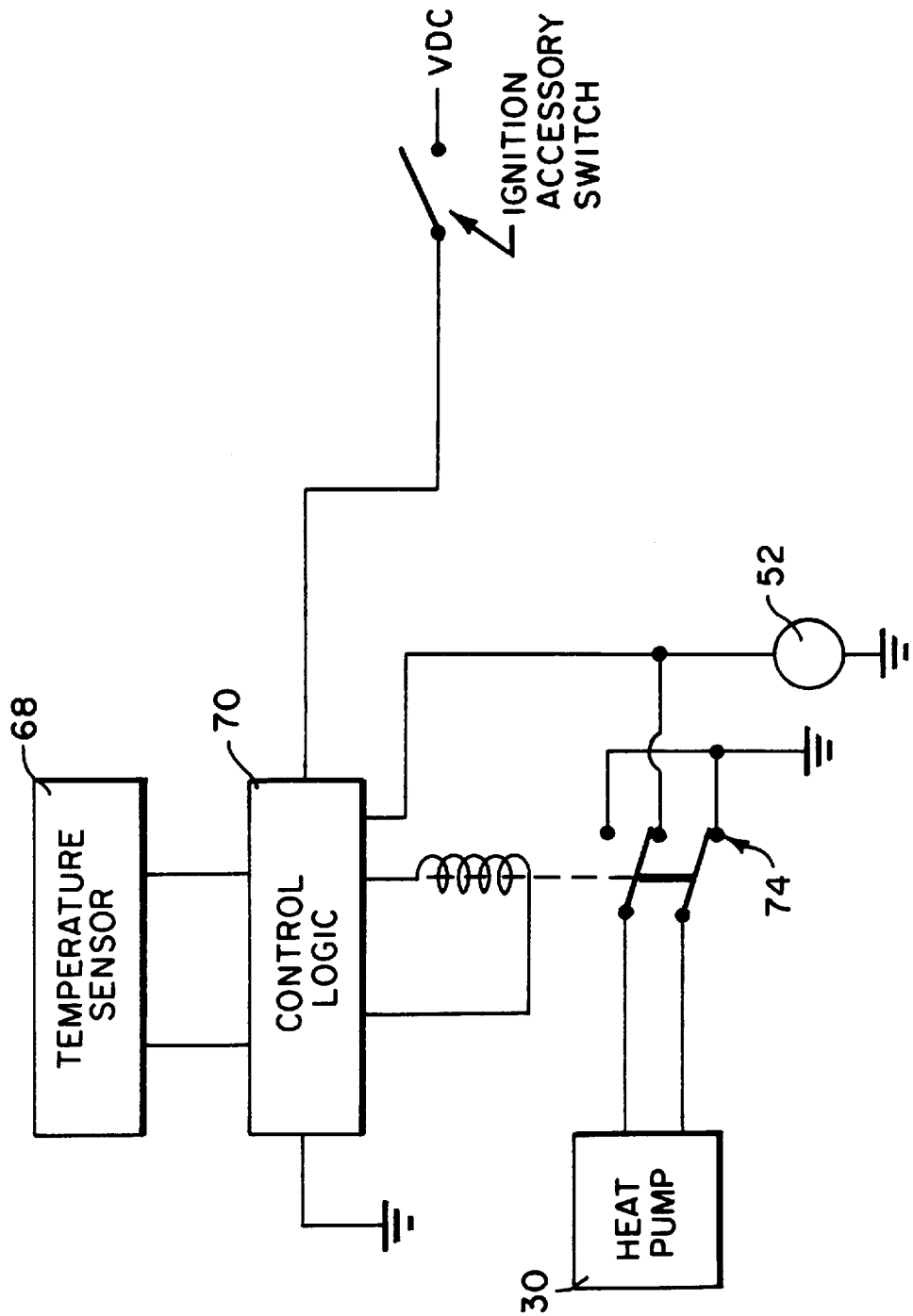
FIG. 10 is an electrical schematic of apparatus for automatically controlling the invention operation.

Since it is common knowledge that climatic temperature varies considerably and often on short notice, it is preferable that the subject invention be automatically controlled to respond satisfactorily to vehicle ambient temperature producing vehicle steering wheel temperature extremes. FIG. 10 depicts a circuit schematic of apparatus 67 for accomplishing this. In particular, a temperature sensing device 68, optionally located in the vehicle environment generally or adjacent the heat pump 20, provides a change in an electrical characteristic functionally related to temperature. The device 68 is interconnected with a control circuit 70 for driving a relay coil 72 to energize the thermoelectric device 30 responsive to the ambient temperature reaching an extreme value. The relay points 74 are arranged in a double-pole, double-throw configuration so as to be able to place the device 30 in either heating or cooling mode, as needed.

Although the invention is described in connection with preferred embodiments, those skilled in the appertaining arts may contemplate changes that come within the spirit of the invention disclosed and the ambit of the appended claims. For example, the invention can be utilized for a steering wheel which has a geometry other than the conventional circular form, such as in the shape of a so-called "joystick" control. Also, instead of a thermoelectric heat pump, a Stirling cycle heat pump can be advantageously employed especially for "cooling" mode use.

What is claimed is:

1. A selectively temperature conditioned automotive vehicle steering wheel assembly, comprising:
   a steering wheel including a hand-gripping portion and arm means interconnected with the hand-gripping portion and extending therefrom:
   electrically energizable thermoelectric heat pump means mounted on the arm means spaced from the steering wheel hand-gripping portion in the ambient air for providing a first surface having a modified temperature from vehicle ambient temperature and a second surface in heat exchanging contact with the ambient air and having a temperature modified oppositely from that of said first surface;
   heat exchanger means mounted on the steering wheel hand-gripping portion; and
   heat transfer means interconnecting the modified temperature first surface with the heat exchanger means.

2. A steering wheel assembly as in claim 1, in which the steering wheel hand-gripping portion has first and second spaced apart regions interconnected by said arm means; and first and second individual heat exchanger means mounted respectively on the first and second hand-gripping portions.

3. A steering wheel assembly as in claim 1, in which the heat pump means is a thermoelectric device providing temperature modification of the first and second surfaces in a direction according to polarity of energizing voltage.

4. A steering wheel assembly as in claim 3, in which the thermoelectric device is a Peltier device.

5. A steering wheel assembly as in claim 1, in which the heat pump means includes a secondary heat exchanger and rotary fan for moving an ambient air stream across said secondary heat exchanger in a direction away from the modified temperature first surface and away from the heat exchanger means.

6. A steering wheel assembly as in claim 2, in which the heat transfer means includes a heat pipe having an outer end portion surface in heat conducting contact with the temperature modified first surface of the heat pump means, said heat transfer means having first and second other end portions in heat conducting relation with said first and second individual heat exchanger means, respectively.

7. A steering wheel assembly as in claim 6, in which the first and second heat exchanger means are located below the heat pump means; and the heat pipe portions extend generally downwardly along a gravity path toward the first and second heat exchanger means.

8. A steering wheel assembly as in claim 2, in which each heat exchanger means includes a hollow metal tube received onto the hand-gripping portion of the steering wheel contacting a heat transfer means.

9. A steering wheel assembly as in claim 8, in which each heat exchanger tube includes a continuous elongated slot via which said tube is assembled onto the steering wheel hand-gripping portion and heat transfer means.

10. A steering wheel assembly as in claim 6, in which the heat pipe is a copper/water device.

11. A steering wheel assembly as in claim 2, in which first and second grooves are formed respectively in the arm means and hand-gripping portion regions of the steering wheel for receiving the heat transfer means therein.

12. A steering wheel assembly as in claim 1, in which there is further provided circuit apparatus responsive to ambient temperature for approximately energizing the heat pump means to compensate for steering wheel temperature extremes.

13. Apparatus for selectively modifying temperature of hand-gripping portions of a vehicle steering implement, comprising:
   selectively energizable heat pump means mounted to steering implement exterior and spaced from said hand-gripping portions for changing the temperature of a surface on said means in a direction dependent upon polarity of energization;
   means for interconnecting the pump means with a source of electrical voltage in either of two polarities;
   a heat pipe having one portion in contact with the changed temperature surface; and
   a hand-grippable heat exchanger contacting and substantially enclosing another portion of the heat pipe remote from said first described heat pipe portion.

14. Apparatus as in claim 13, in which the heat pump means includes an auxiliary heat exchanger; and a source of pressurized air for directing a stream thereof across surface other than the first described surface of said auxiliary heat exchanger, said pressurized air having a temperature such as to increase the operational efficiency of said heat pump means.

15. Apparatus as in claim 14, in which the heat pump means includes an auxiliary heat exchanger and there is further provided hollow tube means having a first end connected to the source of pressurized air and a second end positioned to direct the pressurized air onto the auxiliary heat exchanger.

16. Apparatus as in claim 15, in which there is further provided slip-ring wall means encompassing the tube second end and auxiliary heat exchanger.

17. Apparatus as in claim 13, in which said circuit means cycles between opposing polarity energization of the heat pump means to regulate temperature of the hand-grippable heat exchanger.

* * * * *